United States Patent
Reiser et al.

(10) Patent No.: US 6,686,748 B2
(45) Date of Patent: Feb. 3, 2004

(54) PROCEDURE ARRANGEMENT AND SENSOR FOR TESTING OF THE H-F TIGHTNESS OF THE JUNCTION BETWEEN TWO ADJACENT PARTS

(75) Inventors: Peter Reiser, Waldbronn (DE); Robert Benko, Straubenhardt-Conweiler (DE); Hans Martin Schwenk, Straubenhardt (DE)

(73) Assignee: Schroff GmbH (DE)

( * ) Notice: Subject to any disclaimer, the term of this patent is extended or adjusted under 35 U.S.C. 154(b) by 3 days.

(21) Appl. No.: 10/117,607

(22) Filed: Apr. 4, 2002

(65) Prior Publication Data

US 2002/0145436 A1 Oct. 10, 2002

(30) Foreign Application Priority Data

Apr. 6, 2001 (EP) .............................................. 01108665

(51) Int. Cl.$^7$ ......................... G01R 27/28; G01R 27/04
(52) U.S. Cl. ...................... 324/627; 324/637; 324/557; 324/641
(58) Field of Search ................................ 324/627, 628, 324/632, 637, 639, 642, 538, 539, 541, 543, 544, 557, 715, 718, 641, 644, 240, 527; 174/35 C, 74 R, 74 C, 84 R, 84 C; 73/600

(56) References Cited

U.S. PATENT DOCUMENTS

| | | | | |
|---|---|---|---|---|
| 4,647,844 A | * | 3/1987 | Biegon et al. | 324/627 |
| 4,789,829 A | * | 12/1988 | Stribling | 324/263 |
| 4,797,621 A | * | 1/1989 | Anderson et al. | 324/533 |
| 5,477,157 A | * | 12/1995 | Lee | 324/718 |
| 6,118,281 A | * | 9/2000 | Walter | 324/627 |

* cited by examiner

Primary Examiner—N. Le
Assistant Examiner—Vincent Q. Nguyen
(74) Attorney, Agent, or Firm—Schwegman, Lundberg, Woessner & Kluth, P.A.

(57) ABSTRACT

Arrangement to test HF tightness of a junction between two adjacent parts including HF generator (4), HF line that guides the signal over junction (1), measuring device (10) as well as a signal analyzer. HF line includes two waveguides (5a, 5b) that have inner conductors (6a, 6b) connected all the way through by a connection conductor (9) and outer conductors (7a, 7b) interrupted and each connected with electrodes (8a, 8b). A capacitive coupling of the HF signal occurs on one side of the junction and a capacitive decoupling of the HF signal takes place on the other side. By comparing the measured transmission and/or reflection of the HF signal with a transmission or reflection characteristic for the junction, it can be determined if the junction is HF tight. This makes it possible to test HF shielded cases for HF tightness in a non-destructive manner and without interfering with the contents.

22 Claims, 6 Drawing Sheets

PROCEDURE ARRANGEMENT AND SENSOR FOR TESTING OF THE H-F TIGHTNESS OF THE JUNCTION BETWEEN TWO ADJACENT PARTS

The present application claims priority of EP application no. 01108668.9, filed Apr. 6, 2001, which is incorporated herein by reference.

FIELD OF THE INVENTION

The invention concerns a method and structures for the testing of the electromagnetic leakage of a junction between two adjacent, electrically conductive parts, especially the cover parts of a high frequency (HF)-shielded case for the electromagnetic alternating fields. However, electronic equipment itself often generates electromagnetic waves. To ensure the electromagnetic tolerance, (EMC), the cases for the installation of electronic equipment must therefore be shielded against irradiation and emission of electromagnetic waves.

The tightness of a case against high-frequency electromagnetic oscillation is based on the shielding effect of the metallic walls. Essentially, two physical effects are responsible for this. First, the incident waves induce high-frequency currents in the parts, which generate opposite arranged electromagnetic waves. Thereby the incident electromagnetic wave is reflected. On the other hand, the skin effect that occurs with high frequencies has the result that the currents caused by the high frequency only flow on the surface of the part facing the incoming wave. The penetration depth of the HF current decreases with increasing frequency and already remains clearly below the thickness of a common case wall at relatively low frequencies. This has the result that the electromagnetic waves hitting the surface cannot reach the inside of the case trough the metallic wall.

A problem regarding the HF-tightness of a case occurs in most of all the junctions between two adjacent parts made of metal or another, electrically conductive material, like between a door and door frame or between side and back wall for example. At such a junction the flow of the HF induced current is interrupted, and as a result, the junction becomes pervious to high frequency magnetic waves. For HF shielded cases the junctions between two adjacent parts are therefore sealed with the help of special, electrically highly conductive HF seals against the penetration or escape of HF radiation. Such HF seals are especially used between flexible cover parts, for example door and door frame of a case. The extent of the HF-tightness of such a case, sealed with HF seals that were installed later that seal the junctions, is essentially determined by the quality and the perfect fit of the HF seal between the two adjacent cover parts.

Two methods are common to test if a case assembled from several pieces possesses a sufficient HF tightness.

For the shield attenuation measurement, a HF transmitter is positioned outside the case and a receiving antenna inside, or vice versa. The attenuation, which the high frequency encounters through the closed case, is measured. A big disadvantage of this method that only the total attenuation of the complete case is measured at all times; individually leaking areas cannot be detected. An additional disadvantage is, that the measurement can only be performed on an empty case, and that the case must be irreparably damaged for the measurement. The reason is, that it is necessary to position either the transmission antenna or the receiving antenna in the (empty) inside of the case and to connect it with the other measurement equipment by means of at least one cable that runs through an opening of the case. That means, it is not possible to test a case already equipped with electronic parts for damaged shielding contacts or HF seals in the area of the doors, for example or if the case might not have been set up correctly, so that individual HF seals do not supply contact.

With the second method, the measuring of the HF tightness of a case by injection of current, a high frequency electromagnetic wave is generated between the case and an injection wire. The high frequency emission is received with an additional wire or a receiving antenna, which must be positioned inside the case. Here, too, only empty cases can be tested with this method. Another disadvantage is furthermore, that the cable shield must be galvanically connected with the case, which necessarily goes hand in hand with damage to the case surface, which is usually coated with an isolating varnish.

Both mentioned test procedures have the disadvantage in common that the measuring result is falsified by cavity resonances, leading to a bad reproducibility of the measurements. But extremely disturbing in praxis is that in each case the test piece is irreparably damaged and it is therefore not possible, to later examine the HF tightness of a case equipped with electronic devices, for example in case of a complaint. It is also not possible with the known methods to find individual HF pervious or permeable locations.

A test procedure is known from U.S. Pat. No. 5,477,157 that measures the current that decreases over the junction of a metal case. To this end, a signal source is connected with a final resistor via a coaxial conductor with inner and outer conductor. The outer conductor is sliced open and both open ends are connected to the case to be examined, so that the junction of the case is positioned between both ends and a current flows from the signal source over the junction of the case.

Besides this feed-in electrical circuit a second, separated measuring circuit is intended which consists of a measuring device and two connected electrodes. Each electrode is in contact with the case on each side on the junction. The voltage drop over the junction is measured with the measuring device.

This known testing device has several disadvantages. The inner conductors of the connected coaxial cable must be installed in a predetermined way due to design and geometric considerations. The testing device and the terminator must be electrically adapted to avoid reflections of the incoming signal, which falsify the test result. A miniaturization of the test device is possible only to a very small extent, due to the design.

The separation of the feed-in circuit and the measuring circuit results in the serious disadvantage that the measured values, established with the testing device show a positive result if a good, meaning low-impedance junction between the case parts is present, or if the electrodes are positioned wrongly, or if the equipment is defective. It is therefore not possible to distinguish between a low-impedance junction and a measuring error.

The invention at hand is based on the technical problem to test a junction between two adjacent parts reliably and without error, especially between two walls of a case, to test selectively for HF tightness, without any mechanical interference with the structure of the test piece.

The solution to this task is based on the thought that a measuring of the absolute value of the transmission and/or refection is not necessarily required to determine if a junction between two adjacent parts is pervious for high frequency electromagnetic oscillation or not, and that it is also not necessary to send electromagnetic waves through the parts, from the inside out, or in reverse, from the outside in.

SUMMARY

The problem is first of all solved with the procedure for testing the high frequency (HF) tightness of a junction between two adjacent, electrically conductive parts, especially cover part of a HF shielded case for the installation of electronic equipment, including:

Generating of a signal of high frequency electromagnetic oscillation;

Sending of the HF signal over the junction to be tested;

Measuring of the transmission and/or reflection of the HF signal on its way over the junction;

Comparing the measured transmission and/or reflection with a predetermined transmission and/or reflection characteristic for the junction.

In an embodiment of the present invention, the procedure of the present invention includes:

the HF signal consist of a series of electromagnetic oscillations with different frequencies; and the course of the transmission and/or reflection is measured in correlation of the frequencies.

In an embodiment of the present invention, the measured course of the transmission and/or reflection is compared to a previously saved characteristic course of the transmission and/or reflection signal.

In an embodiment of the present invention, the measured course of the transmission and/or reflection and the saved characteristic course of the transmission and/or reflection are illustrated together on a monitor.

In an embodiment of the present invention, the HF signal is coupled into the one of the two adjacent parts on the one side of the junction. In an embodiment of the present invention, the HF signal is decoupled from the other part (2b) on the other side of the junction.

In an embodiment of the present invention, the coupling and the decoupling of the HF signal occurs capacitively.

According to the invention, a HF signal is sent over the junction to be tested and the transmission and/or reflection of the signal is measured on its way over the junction. It can be established, by comparing the measured transmission and/or reflection with a characteristic transmission and/or reflection predetermined with the geometry of the junction whether the junction possesses the necessary HF tightness or not. The detection of a significant deviation of the measured values for the transmission or reflection from the characteristic values is sufficient for the determination; an absolute value does not have to be measured.

The big advantage of the procedure according to the invention is that the HF signal does not have to penetrate the conductive parts. That makes it possible, for the first time, to test a case in closed condition that is equipped with electronic devices, the way it is normally used, for HF tightness. HF transmitter and HF measuring device are both positioned outside the case. Another big advantage of the suggested procedure is that the comparative measuring makes it possible to locate leaks in different areas of the junction.

Preferably, the HF signal consists of a sequence of electromagnetic oscillations with different frequencies and the course of the transmission and/or reflection is measured in correlation to the frequency. The HF signal typically consists of tuned sine signals, but a jump or impulse signal can be used as an alternative since such a signal already contains a broad frequency spectrum and the analysis in the time frame therefore corresponds with the examination in the frequency range.

Due to its geometry, each junction has a characteristic transmission and/or reflection course in correlation to the frequency of the HF signal. A flawless junction can therefore be recognized by its characteristic transmission and/or reflection course, comparable to a fingerprint. A deviation of the measured course of the transmission and/or reflection from the expected characteristic course of the transmission and/or reflection implies that the junction is defective and pervious for HF.

A typical problem for HF shielded cases is the sporadic leakiness of a HF seal, for example between door and doorframe. Several measurements are performed to locate the leaking spot of a junction, to first of all obtain a characteristic course of the transmission and/or reflection as a reference. This characteristic course of the transmission and/or reflection is saved. If the measured course of the transmission and/or reflection deviates at a particular point of the junction in an obvious way from the saved characteristic course of the transmission and/or reflection, the reason must be a leak in the area of the junction. A series of measurements at different points can narrow down the area of the junction that is flawlessly sealed and the locations that are HF pervious.

In the practical application, the use of a monitor that shows the measured flow of the transmission and/or reflection and the saved characteristic course of the transmission and/or reflection together, proved to be useful. In this manner, a deviation from the characteristic course of the transmission and/or reflection can easily be detected. The measured courses of the transmission and/or reflection can also be evaluated numerically, for example with a microcomputer. The result will be displayed as a good/bad display, which could be done optically as well as acoustically.

In a preferred advancement of the procedure according to the invention, the HF signal is coupled on the one side of the junction to be tested and decoupled on the opposite side of the junction, whereby the coupling and decoupling of the HF signal in the conducting parts is done capacitively for practical purposes. This allows, for the first time, to also test cases filled with electronic gear for their HF tightness without damaging isolating protective coats, such as varnish, and therefore completely in a non-destructive manner.

The present invention further includes an apparatus for testing the HF tightness of a junction between two adjacent, electrically conductive parts, especially the cover part of a HF shielded case for the installation of electronic equipment, with a HF generator that generates a signal of high frequency electromagnetic oscillation. The apparatus includes:

a HF line that guides the HF signal from the HF generator over the junction to be tested;

a measuring device that measures the transmission and/or reflection of the HF signal through the junction; and an analyzer which compares the measured transmissions and/or reflections with a predetermined transmission and/or reflection that is characteristic for junction.

In an embodiment of the apparatus, the HF generator generates a series of electromagnetic oscillations with different frequencies. In an embodiment, the measuring device measures the course of the transmission and/or reflection dependent on the frequencies of the series of oscillations. In an embodiment, the analyzer compares the measured course of the transmission and/or reflection with a previously saved characteristic course of the transmission and/or reflection. In an embodiment the analyzer contains a monitor, which displays the measured course of the transmission and/or reflection and the saved characteristic course of the transmission and/or reflection together. In an embodiment, the apparatus includes a first wave guide that guides the HF signal between an inner conductor and an outer conductor from the HF generator to the junction. In an embodiment, the apparatus includes a first electrode that couples the HF signal in the one of the two adjacent parts on the one side of the junction and that is connected to the outer conductor of the first wave guide in an electrically conductive manner. In an embodiment, a second wave guide, which guides the HF signal between an inner conductor and an outer conductor away from the junction to the measuring device, is provided. In an embodiment, a second electrode decouples the HF signal from the other part on the opposite side of the junction is connected with the outer conductor of the second wave guide in an electrically conductive manner. In an embodiment, a connection conductor connects the inner conductor of the first wave guide with the inner conductor of the second wave guide in an electrically conductive manner, whereby the connection conductor leads past the junction. In an embodiment, the HF line is a coaxial cable, whose inner conductor is run past the junction as a connection conductor, and whose outer conductors are interrupted in the area of the junction.

An embodiment of the apparatus of the present invention serves for the execution of the method according to the invention. The apparatus includes an HF generator that generates a HF measuring signal, which is part of the test arrangement. Another part of the test arrangement is an HF cable that conducts the HF signal from the HF generator across the junction to be tested, which leads to a partially attenuated and/or reflected HF signal. The measuring equipment detects this influence. An analyzer compares the measured values for the transmission and/or reflection with the predetermined characteristic values. A significant deviation implies a defective junction.

A tunable frequency generator is used as HF generator in an embodiment. The HF signal typically has one frequency range, which corresponds roughly with the frequency range of the HF radiation to be shielded, for example 30 MHz to 1000 MHz.

The analyzer, in an embodiment, contains a storage unit to save the characteristics or data of the transmission and/or reflection signals, so that a comparison can be made between the actually measured actual data with the expected nominal data. The results of this comparison can be displayed on the monitor as measured curves, for example. Alternatively, the test results can also be evaluated numerically and the output of the result "good" or "bad" can be demonstrated as a light or sound signal.

In an embodiment, a wave guide with an inner and outer conductor is used to send the HF signal over the junction to be tested. A first wave guide sends the HF signal to the junction. Here, the HF signal is coupled in one of the two adjacent parts on the one side of the junction. A first electrode is designated for this purpose, which is connected with the outer conductor of the first wave guide in an electrically conductive fashion. A second, similar wave guide sends the HF signal away from the junction to the measuring equipment. A second electrode, which is electrically conductive, is connected with the outer conductor of the second wave guide, is designed to decouple the HF signal from the other part of the opposite side of the junction. The inner conductors of both wave guides are connected in an electrically conductive fashion with each other through a connection conductor, and this connection conductor is run past the junction.

In an embodiment, a coaxial cable is used that has an inner conductor that runs the junction, and outer conductor is interrupted in the area of the junction. In an embodiment, the two missing outer conductors in the area of the junction are replaced by the two electrodes and the two adjacent, electrically conductive parts. The electromagnetic waves are carried between the surfaces of the adjacent parts and the inner conductor of the coaxial cable over the junction to be tested.

An embodiment of the present invention includes a sensor for testing the HF tightness of a junction between two adjacent, electrically conductive parts, especially cover parts of a HF shielded case for the installation of electronic equipment, which includes:

a first wave guide, which guides a HF signal between an inner conductor and an outer conductor;

a first electrode, which is connected with the outer conductor of the first wave guide in an electrically conductive manner and serves to couple the HF signal in the one of the two adjacent parts on the one side of the junction;

a second wave guide with an inner conductor and an outer conductor for the connection of a measuring device;

a second electrode, which is connected with the outer conductor of the second wave guide in an electrically conductive manner, and serves to decouple the HF signal from the other part on the other side of the junction;

a connection conductor, which electrically conductive connects the inner conductor of the first wave guide with the inner conductor of the second wave guide.

The first wave guide and the second wave guide, in an embodiment of the present invention, are formed as sections of a coaxial cable, whose outer conductors are interrupted in the area between the two electrodes and whose inner conductors are connected all the way through. In an embodiment, the two electrodes are formed like plates and are planar. In an embodiment, the electrodes are positioned on one level and their ends are facing each other. In an embodiment, the electrodes are positioned in a right angled to each other. In an embodiment, the electrodes are positioned parallel and with distance to each other. In an embodiment, the two electrodes are attached to a bracket that fits the contour of the case. In an embodiment, a handle is connected to the bracket through which the two wave guides are threaded.

The sensor according to an embodiment of the present invention includes an HF generator connected to the first wave guide, a measuring device connected to the second wave guide. In an embodiment, the HF generator and the measuring device are integrated in the sensor. The sensor according to an embodiment of the present invention includes an analyzer for the evaluation of the signals received by the measuring device.

A sensor according to an embodiment of the present invention performs the procedure according to the invention within the scope of the suggested test arrangement. The sensor, according to the invention, includes a first wave guide and a second wave guide, as well as a first electrode for the coupling of the HF signal on the one side of the junction and a second electrode for the decoupling of the HF signal on the other side of the junction.

The electrodes of the sensor are planar or plate-like and can be positioned at a single level. Such a sensor is particularly well suited for testing junctions between two flat parts that connect with their outside edges.

As an alternative, the sensor can also be equipped with right-angled electrodes facing each other. A sensor equipped such allows for the testing of junctions in angular configurations, for example, joints in the corners of a case.

Finally, the electrodes can also be positioned parallel and at a distance to each other. That allows for easy testing of junctions and HF seals in gaps.

A practical and advantageous improvement of the sensor has a bracket that fits the contour of the case to be measured, whereby the electrodes are intended to be on the inside of the bracket facing the case. This construction guaranties that the electrodes are always at a defined distance to each other and to the junction to be tested, so that a series of comparative measurements can be performed under always constant geometrical conditions.

If the sensor also has a handle that is connected to the bracket, it can easily be slid alongside a junction, to perform measurements at different points. Both wave guides can be threaded through the handle so that they don't interfere with the movement of the sensor by hand.

A HF generator and a measuring device are integrated in the sensor as an advantageous improvement of the sensor according to the invention, in which the HF generator is connected to the first wave guide and the measuring device to the second wave guide. This generates a compact, easy to handle test device, which is easy to transport and can be used on site. For practical purposes, the sensor also contains an analyzer for the evaluation of the signals received by the measuring device, whereby the result of the test can be reported optically, for example with a red/green light diode or acoustically, e.g., with a Piezo-sound converter.

BRIEF DESCRIPTION OF THE DRAWINGS

The invention is explained in the following in more detail with the help of the enclosed drawings.

The drawings show the same elements with the same reference numbers.

DETAILED DESCRIPTION

Figure 1:
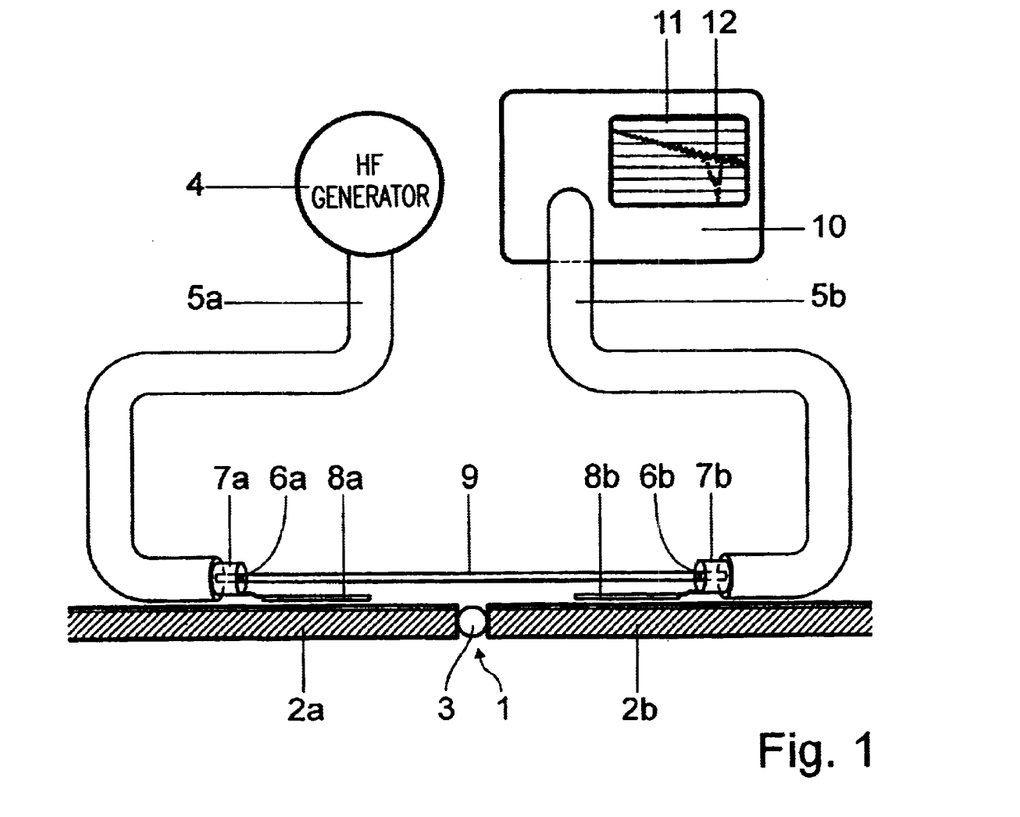
FIG. 1 an arrangement for testing a junction between two plane parts, in an extremely simplified schematic diagram.

The schematic arrangement illustrated in FIG. 1 serves to test the HF tightness of a junction 1 between two adjacent flat parts 2a and 2b of a case for the installation of electronic equipment. HF tightness refers to the ability opaqueness of the junction to electromagnetic radiation. It is desirable to provide a junction that prevents HF signals from entering the case and/or prevents HF signal from exiting the case. A HF seal 3 of electrically highly conducting material is inserted between both parts 2a and 2b. In an embodiment, parts 2a and 2b are planar cover parts made of metal. An HF generator generates a series of electromagnetic sine-oscillations between 30 and 1,000 MHz. A first wave guide 5a sends the HF signal from HF generator 4 to junction 1. Wave guide 5a is designed as a coaxial cable and has an inner conductor 6a and an outer conductor 7a, which carry the HF signal. The first electrode 8a is electrically conductive and connected with the outer conductor 7a of the first wave guide 5a. The electrode 8a is formed flat and is positioned on the top of part 2a. That way, the HF signal generated by the HF generator is capacitively coupled in the first of the two adjacent parts 2a on the left side of the junction 1.

The HF signal is decoupled from the second part 2b on the other side of the junction 1. A second wave guide 5b is intended for this purpose, which is also designed as a coaxial cable and which contains an inner conductor 6b and an outer conductor 7b. The outer conductor 7b of the second wave guide 5b is electrically conductive and connected with a second electrode 8b. The second electrode 8b capacitively decouples the HF signal from the second part 2b on the right side of junction 1.

In this arrangement, the outer conductors 7a, 7b of the wave guide 5a, 5b are interrupted several centimeters in front and behind junction 1. But the inner conductors 6a, 6b are connected with each other electrically conductive through a connection conductor 9 and the connection conductor 9 is guided over the junction 1 within a distance of a few millimeters.

The two wave guides 5a and 5b are therefore two sections of a coaxial cable, whose outer conductor is interrupted in the area of junction 1, while the inner conductor remains connected all the way through. The outer conductor missing in the area of the junction is replaced by the flat electrodes 8a and 8b, the top side of the adjacent parts 2a and 2b as well as the HF seal 3 positioned in between.

This way, the HF signal is guided over junction 1 and the HF signal is subject to a definite change of the transmission due to the occurrence of reflections at the junction points. The extent of the transmission and/or reflection depends on the geometry of the junction, especially on the conductivity and the correct fit of the HF seal 3 in the gap between the two parts 2a and 2b.

The second wave guide 5b sends the HF signal, decoupled from the right part behind the junction 1, to a measuring device 10. The measuring device 10 is connected with an analyzer, which performs a numeric evaluation of the measured values for the transmission of the HF signal. The behavior of the transmission in correlation of the frequency is displayed on monitor 11.

Figure 2:
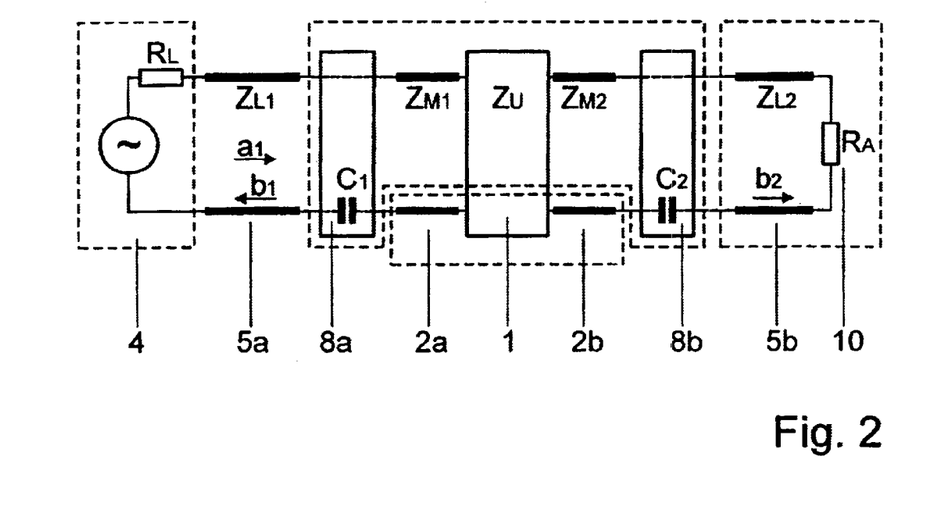
FIG. 2 an electrical equivalent circuit diagram of the arrangement in FIG. 1.

The electrical equivalent circuit diagram of FIG. 2 explains the measuring principle. The HF signals $a_1$, generated by the HF generator 4, are sent to the junction 1 that is to be tested via wave guide 5a. The wave guide 5a has a known wave resistance ZL1. The HF signal is coupled capacitively in the first part 2a via the first electrode 8a. Thereby, the electrode 8a forms a high-pass filter with the capacitor C1. The HF signal is capacitively decoupled again from the other part 2b by the second electrode 8b on the opposite side of the junction 1. The second electrode 8b and the part 2b form a high-pass with the capacitor C2. The wave guide 5b which diverts the HF signal from junction 1 forms, together with the connected measuring device C, a load with the wave resistance ZL2 and the ohm resistance $R_A$.

The wave guide formed from the connection of conductor 9 (compare FIG. 1), the adjacent parts 2a and 2b and the junction 1 with HF seal positioned in between, has a wave resistance that is formed from the wave resistance ZM1 of the first part 2a, the wave resistance ZU of the junction 1 and the wave resistance ZM2 of the second part 2b. Here, the wave resistances ZM1 and ZM2 are independent from junction 1. The wave resistance ZU of the junction deviates from the wave resistances ZM1 and ZM2, resulting in a partial reflection of the HF signal.

The transmitted portion b2 of the HF signal at the end of the test line is received by the measuring device 10. The reflected signal portion b1, as well as the transmitted signal portion b2 show a characteristic frequency dependency, which depends on the geometry of junction 1. If junction 1 is defective, meaning pervious to HF electromagnetic signals or radiation, the frequency dependency changes significantly; this allows the detection of an impurity spot or defect in the junction. The transmission T is recorded in decibel (dB) over the frequency in Hertz (Hz), see FIG. 3.

Figure 3:
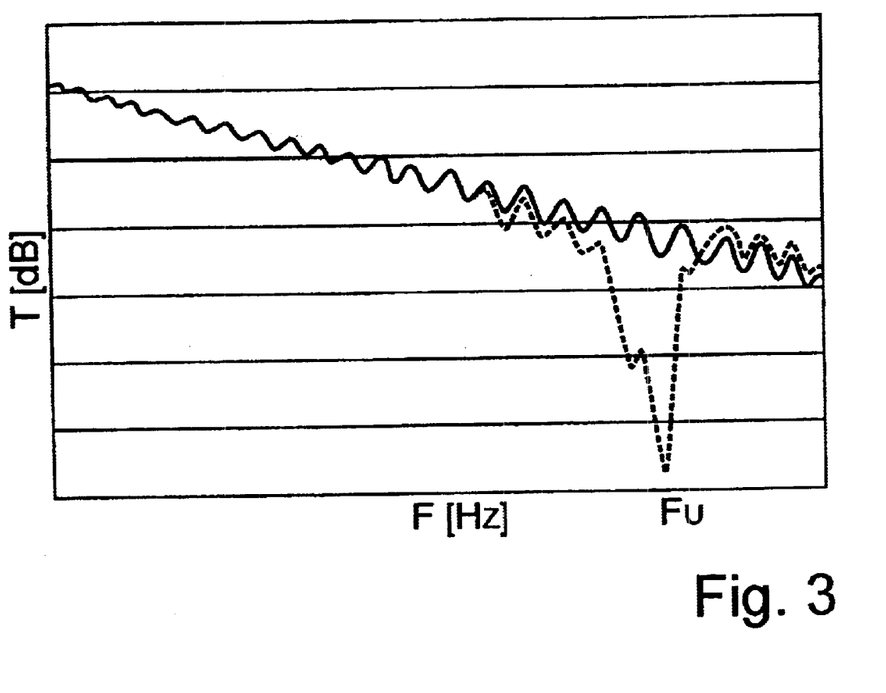
FIG. 3 two different courses of the transmission in comparison.

FIG. 3 shows two graph curves (courses) of the transmitted parts of the HF signal for junction 1. The solid curve is the characteristic course (expected response signal) of the transmission, determined by the geometry of the junction 1. This indicates a drop toward higher frequencies, as well as smaller collapses or increases that are caused by resonances. The dotted curve is a typical course (actual response signal) of the transmission, as it will be received due to a faulty junction. Clearly visible is the extreme collapse of the signal level at the frequency $F_u$.

The measuring arrangement must be coordinated with the geometry of the junction. Differently designed sensors are used, depending on whether the adjacent parts 2a and 2b which form the junction 1, are on one level (in the same plane), form a corner configuration or are positioned parallel to each other.

Figure 4A:
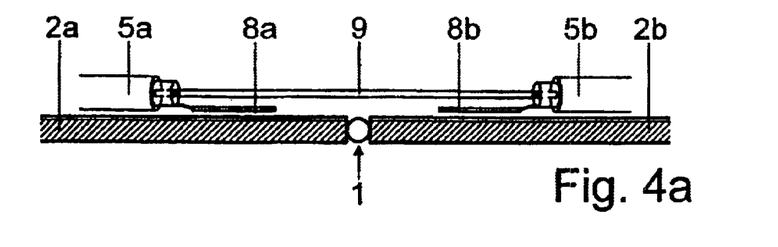
FIG. 4a a simplified sensor for the testing of different junctions.

FIG. 4a shows a flat sensor to test junctions between two adjacent, flat parts 2a, 2b that are positioned on the same level. Both electrodes 8a and 8b are plate-shaped and are positioned on one level and point their ends towards each other. Both electrodes 8a and 8b include a planar surface for adjacent the parts 2a, 2b, which also have a planar surface. Both electrodes 8a and 8b are positioned in a same plane and have their free ends pointed towards each other.

Figure 4B:
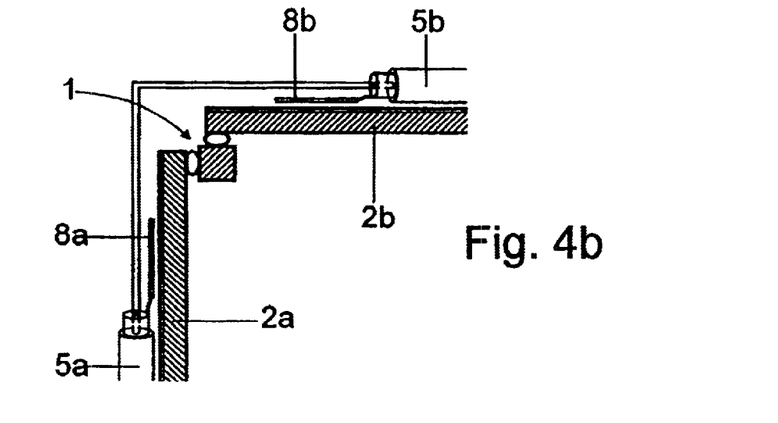
FIG. 4b a further embodiment of a simplified sensor for the testing of different junctions.
Figure 4C:
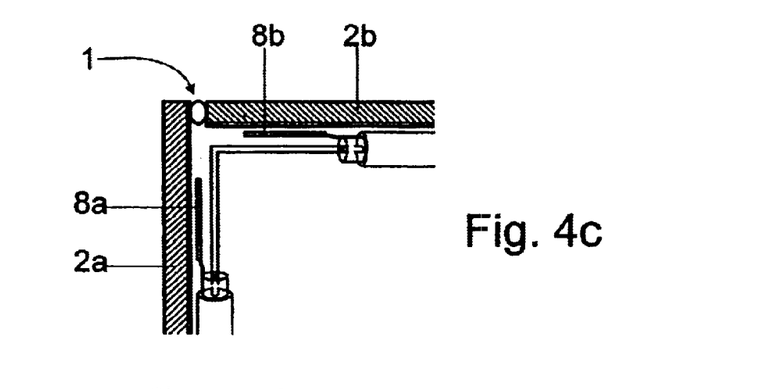
FIG. 4c a further embodiment of a simplified sensor for the testing of different junctions.

It is often necessary to test junctions between two parts 2a, 2b, which form the corner of a case. The parts 2a, 2b as shown in FIG. 4b form a right angle. Depending on whether the area of this corner has to be tested from the outside or the inside, a corner sensor according to FIG. 4b or a corner sensor according to 4c is be used. Here, the electrodes 8a, 8b are positioned at a right angle to each other, along the surfaces of the right angle parts 2a, 2b.

Figure 4D:
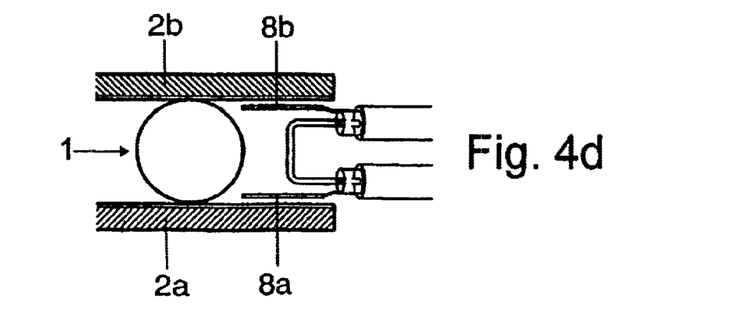
FIG. 4d a further embodiment of a simplified sensor for the testing of different junctions.

Often the junction 1 to be tested also consists of a joint between two parts 2a, 2b that are positioned parallel at a distance to each other (i.e., spaced from each other), as illustrated in FIG. 4d. A junction that is formed in this manner is best tested with a slot sensor in which the electrodes 8a and 8b are positioned parallel and at a distance to each other. The electrodes 8a and 8b are respectively positioned adjacent the parts 2a, 2b.

Figure 5A:
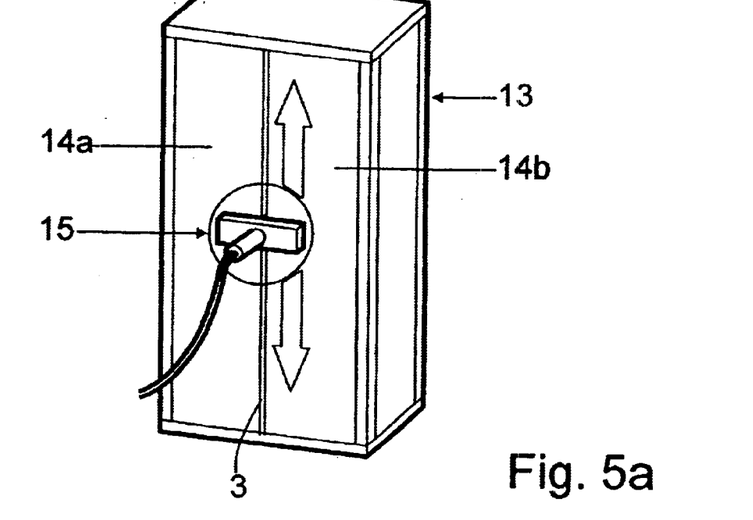
FIG. 5a a closet with a sensor for testing the gap between the doors.

FIG. 5 shows how the HF tightness of a case 13 for electronic equipment may be tested from the outside while the case is closed. The case 13 has two doors 14a and 14b, which correspond with the parts 2a and 2b of the test arrangement in FIG. 1. The gap between the two doors 14a and 14b forms the junction 3, whose HF tightness is to be tested. This is done by a flat sensor 15.

Figure 5B:
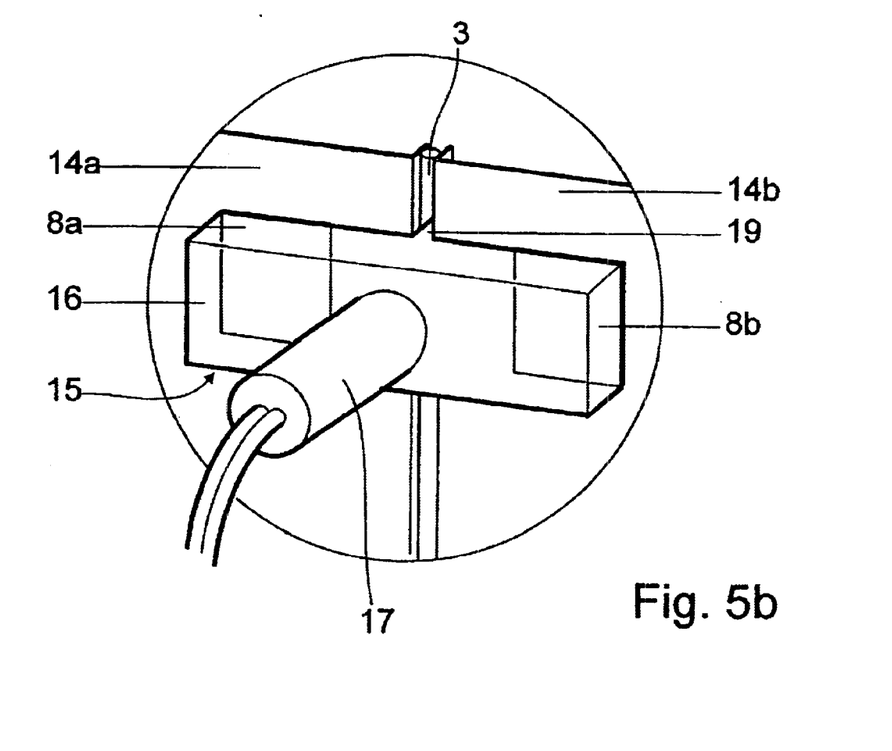
FIG. 5b the sensor of FIG. 5a in enlarged perspective illustration.

According to FIG. 5b, the flat sensor 15 includes a bracket 16 that fits the contour of the case 13. On its essentially flat inside surface, which faces the case 13, the bracket has the two flat-shaped electrodes 8a and 8b. The flat sensor 15 also includes a handle 17 that is connected to bracket 16, through which the two coaxial cables 18a and 18b are threaded. On the side of the bracket 16, opposite of the handle 17, a guiding bar 19 is positioned, which inserts into the gap between the doors 14a and 14b.

By moving the flat sensor 15 up and down, as indicated by the two arrows in FIG. 5a, the course of the transmission and/or reflection of the HF signal for this junction 1 between the doors 14a, 14b can be measured at different locations. By comparison of the received courses of the transmission and/or reflection signals it can be determined whether the gap between the doors 14a and 14b is tight over its entire length or if the junction leaks at a particular location.

Figure 6A:
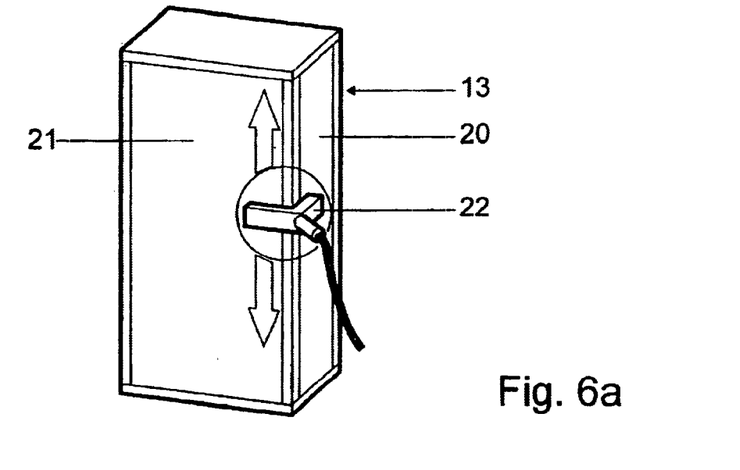
FIG. 6a a closet with a sensor for testing of the joints in a corner.
Figure 6B:
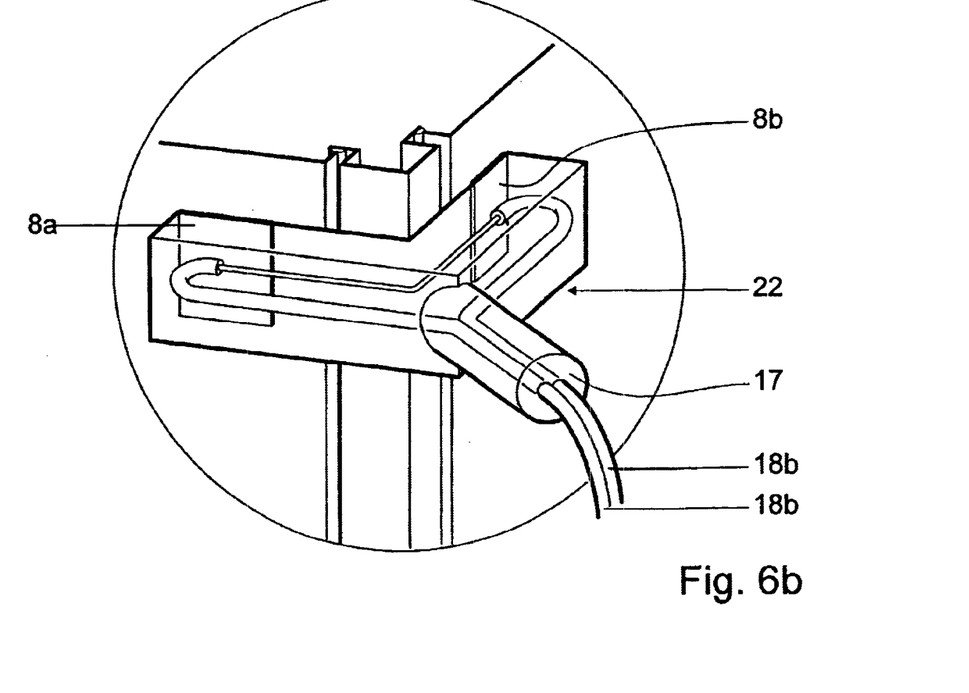
FIG. 6b the sensor of FIG. 6a in an enlarged perspective illustration.

FIG. 6a shows the back side of the case 13. A corner sensor 22, whose electrodes 8a and 8b are positioned towards each other at a right angle, is used to test the tightness of junction 3 between side 20 and backside 21. While, a right angle is shown and discussed, the electrodes may form other angles relative to each other such that the electrodes match a particular angle of the parts to be measured. The coaxial cables 18a, 18b that are threaded through the handle 17 serve to feed the HF signal to one of the parts and receive the leaked signal from the other part. That is, the cables conduct an HF signal to and from the electrodes 8a, 8b.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art.

What is claimed is:

1. A method for testing high frequency electromagnetic tightness of a junction between two adjacent, electrically conductive parts of a HF shielded case for the installation of electronic equipment, including:

generating of a signal of high frequency electromagnetic oscillation;

sending of the HF signal over the junction to be tested;

measuring of the transmission and/or reflection of the HF signal on its way over the junction;

comparing the measured transmission and/or reflection signal with a predetermined transmission and/or reflection signal that is characteristic for the junction.

2. The method according to claim 1, wherein generating includes generating a series of electromagnetic oscillations with different frequencies; and wherein measuring includes measuring the transmission and/or reflection of the HF signal in correlation of the frequencies.

3. The method according to claim 2, wherein the measured HF signal is compared to a previously saved characteristic signal of the transmission and/or reflection.

4. The method according to claim 3, wherein the measured HF signal of the transmission and/or reflection and the saved characteristic signal of the transmission and/or reflection are illustrated together on a monitor.

5. The method according to claim 1, wherein sending the HF signal includes coupling the HF signal into the one of the two adjacent parts on the one side of the junction; and measuring includes measuring a transmitted HF signal from the other part on the other side of the junction.

6. The method according to claim 5, wherein the coupling and the measuring of occurs capacitively.

7. An apparatus for testing the HF tightness of a junction between two adjacent, electrically conductive parts of a HF shielded case for the installation of electronic equipment, comprising:
an HF line that is adapted to transmit an HF signal from an HF generator over a junction to be tested;
a measuring device that is adapted to measure the transmission and/or reflection of the HF signal through the junction; and
an analyzer that is adapted to compare the measured transmissions and/or reflections with a predetermined transmission and/or reflection that is characteristic for junction to be tested.

8. The apparatus according to claim 7, further comprising an HF generator, and wherein the HF generator generates a series of electromagnetic oscillations with different frequencies; and wherein the measuring device measures the course of the transmission and/or reflection dependent on the frequencies.

9. The apparatus according to claim 8, wherein the analyzer compares the measured transmission and/or reflection signal with a previously saved characteristic transmission and/or reflection signal.

10. The apparatus according to claim 9, wherein the analyzer includes a monitor that is adapted to display the measured the transmission and/or reflection signal and the saved characteristic, transmission and/or reflection signal.

11. The apparatus according to claim 7, wherein the HF line includes:
a first wave guide which guides the HF signal between an inner conductor and an outer conductor from the HF generator to the junction;
a first electrode adapted to couple the HF signal in the one of the two adjacent parts on the one side of the junction and is connected to the outer conductor of the first wave guide in an electrically conductive manner; and
wherein the measuring device includes:
a second wave guide which guides the HF signal between an inner conductor and an outer conductor away from the junction to circuits in the measuring device;
a second electrode which decouples the HF signal from the other part on the opposite side of the junction from the first electrode and which is connected with the outer conductor of the second wave guide in an electrically conductive manner; and
a connection conductor, which connects the inner conductor of the first wave guide with the inner conductor of the second wave guide in an electrically conductive manner, whereby the connection conductor leads past the junction.

12. The apparatus according to claim 11, wherein the HF line is a coaxial cable that includes an inner conductor extending past the junction as a connection conductor and outer conductors that are discontinuous in the area of the junction.

13. A sensor for testing high frequency tightness of a junction between two adjacent, electrically conductive parts of an HF shielded case for the installation of electronic equipment, comprising:
a first wave guide, which guides an HF signal between an inner conductor and an outer conductor;
a first electrode connected to the outer conductor of the first wave guide in an electrically conductive manner and couples the HF signal in the one of the two adjacent parts on the one side of the junction;
a second wave guide with an inner conductor and an outer conductor, the second wave guide being adapted to connect to a measuring device;
a second electrode connected to the outer conductor of the second wave guide in an electrically conductive manner and senses an HF signal from the other part on the other side of the junction; and
a connection conductor, which electrically conductively connects the inner conductor of the first wave guide with the inner conductor of the second wave guide.

14. The sensor according to claim 13, wherein the first wave guide and the second wave guide are formed as sections of a coaxial cable, which coaxial cable has outer conductors that are discontinuous in the area between the two electrodes and whose inner conductors are continuous.

15. The sensor according to claim 13, wherein the two electrodes are formed like plates.

16. The sensor according to claim 15, wherein the electrodes are positioned in a same plane and have ends facing each other.

17. The sensor according to claim 15, wherein the electrodes are positioned in a right angle to each other.

18. The sensor according to claim 15, the electrodes are positioned parallel and at a distance to each other.

19. The sensor according to claim 13 further comprising a bracket that fits the contour of the case and has a surface adapted to face the case, and wherein the two electrodes are attached to the surface.

20. The sensor according to the claim 19, further comprising a handle connected to the bracket through which the two wave guides extend.

21. The sensor according to claim 13, further comprising:
an HF generator connected to the first wave guide;
a measuring device connected to the second wave guide; and
wherein the HF generator and the measuring device are integrated in the sensor.

22. The sensor according to the claim 21, further comprising an analyzer for the evaluation of the signals received by the measuring device.

* * * * *